US008742867B2

(12) United States Patent
Veihl et al.

(10) Patent No.: US 8,742,867 B2
(45) Date of Patent: Jun. 3, 2014

(54) CAPACITIVELY COUPLED STRIPLINE TO MICROSTRIP TRANSITION, AND ANTENNA THEREOF

(75) Inventors: Jonathon C. Veihl, New Lenox, IL (US); Jinchun He, Hickory, NC (US); Hangsheng Wen, Hickory, NC (US)

(73) Assignee: Andrew LLC, Hickory, NC (US)

( * ) Notice: Subject to any disclaimer, the term of this patent is extended or adjusted under 35 U.S.C. 154(b) by 234 days.

(21) Appl. No.: 13/439,358

(22) Filed: Apr. 4, 2012

(65) Prior Publication Data

US 2012/0256794 A1 Oct. 11, 2012

(51) Int. Cl.
*H03H 5/10* (2006.01)
*H03H 7/00* (2006.01)

(52) U.S. Cl.
USPC ............. 333/27; 333/116; 333/128; 333/238; 333/246

(58) Field of Classification Search
USPC ............................ 333/27, 116, 128, 238, 246
See application file for complete search history.

(56) References Cited

U.S. PATENT DOCUMENTS

| | | | | |
|---|---|---|---|---|
| 3,771,075 | A * | 11/1973 | Phelan | 333/246 |
| 4,374,368 | A * | 2/1983 | Viola et al. | 333/128 |
| 5,689,217 | A * | 11/1997 | Gu et al. | 333/116 |
| 5,757,246 | A | 5/1998 | Johnson | |
| 6,023,210 | A * | 2/2000 | Tulintseff | 333/238 |
| 8,421,551 | B2 * | 4/2013 | Lascari | 333/33 |
| 2011/0285474 | A1 * | 11/2011 | Ali | 333/33 |

FOREIGN PATENT DOCUMENTS

| | | |
|---|---|---|
| EP | 2 154 747 A1 | 2/2010 |
| WO | WO 2004/055938 A2 | 7/2004 |

OTHER PUBLICATIONS

Extended European Search Report, dated Jul. 17, 2012, corresponding to Application No. EP 12 16 3390.

Huei-Han Jhuang et al., "Design for Electrical Performance of Wideband Multilayer LTCC Microstrip-to-Stripline Transition", Electronics Packaging Technology Conference, 2004. EPTC 2004, Proceedings of 6th Singapore, Dec. 8-10, 2004, Piscataway, New Jersey, IEEE, US, pp. 506-509.

Yijing Fan et al: "Compact CPW-to Microstrip Transition Design for MMIC Packaging", Antennas, Propagation & EM Theory, 2006. ISAPE '06. 7th Inter National Symposium on, IEEE, PI, Oct. 1, 2006, pp. 1-4.

Andres Garcia-Aguilar et al: "Printed Antenna for Satellite Communications", Antennas and Propagation (EUCAP), 2010, Proceedings of the Fourth European Conference, IEEE, Piscataway, New Jersey, Apr. 12, 2010, pp. 1-5.

* cited by examiner

*Primary Examiner* — Hoang V Nguyen
(74) *Attorney, Agent, or Firm* — Husch Blackwell LLP

(57) ABSTRACT

The present invention provides a capacitively coupled stripline to microstrip transition which comprises a stripline, a microstrip, an upper conductive ground plane, a lower conductive ground plane, an insulating layer and an insulating fixing component. The stripline is positioned between the upper conductive ground plane and the lower conductive ground plane, and has a stripline overlap section. The microstrip is mounted on the upper conductive ground plane, and has a microstrip overlap section which penetrates the upper conductive ground plane. Wherein the microstrip overlap section, the insulating layer and the stripline overlap section are attached uniformly and tightly in sequence and fixed together by the insulating fixing component. The present invention further provides an antenna comprising this transition.

41 Claims, 6 Drawing Sheets

CAPACITIVELY COUPLED STRIPLINE TO MICROSTRIP TRANSITION, AND ANTENNA THEREOF

FIELD OF TECHNOLOGY

The present invention relates to the field of RF signal transmission, in particular to a capacitively coupled stripline to microstrip transition, for the effective RF connection of an antenna radiating element and a branch feeder of a power division network, and to an antenna comprising this transition.

DESCRIPTION OF RELATED ARTS

There is a need to transfer RF energy from the stripline phase shifter section to the air microstrip feed section in the low cost antennas. The problem of signal interference has existed in the process of the high-frequency signal transmission from a stripline to a microstrip, in which the very advanced problem of signal interference is the "third-order passive intermodulation" problem (i.e. the PIM problem).

Third-order passive intermodulation means a spurious signal is produced after the beat (frequency mixing) generated with the second harmonic of one signal and the fundamental wave of the other signal due to the presence of non-linearity factor when two signals are present in a linear system. For example, the second harmonic of F1 is 2F1, which generates a spurious signal 2F1-F2 with F2. Since one signal is a second harmonic (a second-order signal), and the other signal is a fundamental signal (a first-order signal), they are combined to be a third-order signal, wherein 2F1-F2 is known as the third-order intermodulation signal that is generated in the modulation process. Also, because the beat signal is generated by the mutual modulation of these two signals, the newly generated signal is called the third-order intermodulation distortion signal. The process of generating this signal is called third-order intermodulation distortion. Similarly, a spurious signal 2F2-F1 is also produced with F2 and F1, as the frequencies of the signals 2F1-F2 and 2F2-F1 lie generally very close to those of the original signals F2 and F1, so as to result in 2F1-F2 and 2F2-F1 within the receiving band of the present system, to interfere with the receiving system, to affect the system capacity of the receiving terminal. This is the third-order passive intermodulation interference.

The problem existed in most existing technologies, for a very long period of time, is to adopt the way of connecting the stripline to the microstrip directly by welding the stripline to the microstrip, so a direct contact between metals will be produced inevitably, thus potentially resulting in the PIM problem, so as to produce the effect of the third-order passive intermodulation to the antenna sooner or later, further to affect the performance of the antenna.

Moreover, the upper ground plane and the lower ground plane of the stripline form a parallel plate mode, which not only can cause the PIM risk, but also causes insertion loss and low isolation from neighboring transitions.

The Chinese patent application CN200820206348.6 disclosed an equal phase difference multi-way phase shifter (microstrip or stripline). It includes sub-phase shifters, sub power dividers and sliding fixture. The sub-phase shifter includes the fixed microstrip (or stripline) and the sliding microstrip (or stripline). They are connected to each other by coupling and when sliding the sliding microstrip (or stripline), the total electrical length changes. In this design, there is a coupling between the microstrips (or striplines) within the same ground plane structure.

The Chinese patent application CN200780023276.X disclosed a phase shifter that could adjust the phase by rotating it. Wherein the transmission lines coupled to each other and when it rotated, the electrical length changed. In this design, the coupled transmission lines are same (microstrip or stripline) with the same grand planes.

The Chinese patent application CN200580016729.7 disclosed a RFID loop antenna coupling to pads, same as U.S. Pat. No. 7,102,587 B2. It mainly uses conductive epoxy to connect metal rivet to the conductor of loop antenna, but does have a claim on using capacitive coupling from the circuitry to the pad of the embedded antenna. However it is the general use of capacitive coupling, not specific to stripline/microstrip transition application.

The claims of the US publication U.S. Pat. No. 6,492,947 focus on controlling electromagnetic coupling between stripline and an aperture opening in one of the ground planes to couple to other circuit elements, such as a patch or a microstrip. Signal transmission is achieved by resonant aperture coupling from stripline conductor to microstrip conductor through resonant opening in a common ground plane.

The EPO patent application EP0833404A2 relates to base station endfire array of monopoles coupled to microstrip or stripline.

The U.S. Pat. No. 4,641,369 has soldered microstrip to suspended stripline directly.

Therefore, all above-mentioned references either relate to the coupling between different elements, do not mention the coupling between one transmission line to another transmission line completely; or relate to the coupling between two same transmission lines, not the coupling between different transmission lines; or relate to the connection between the stripline to the microstrip by soldering directly or adopting different coupling structures. Moreover the signal interference problem is not mentioned in these references at all.

SUMMARY OF THE INVENTION

Aspects of the present invention generally pertain to a capacitively coupled stripline to microstrip transition and an antenna thereof, the capacitively coupled stripline to microstrip transition is designed skillfully, simple in structure, simple and convenient to assemble, has a low cost, avoids metals' direct contact to eliminate the PIM problem, further prevents the parallel plate mode, to further eliminate the PIM risk, improve insertion loss and provide high isolation from neighboring transitions, to completely eliminate unstable factors, and therefore is suitable for large-scale popularization.

In order to realize the above aims, in a first aspect of the present invention, a capacitively coupled stripline to microstrip transition is provided and comprises:

an upper conductive ground plane;

a lower conductive ground plane;

an insulating layer;

an insulating fixing component;

a stripline, positioned between the upper conductive ground plane and the lower conductive ground plane, and having a stripline overlap section;

a microstrip, mounted on the upper conductive ground plane, and having a microstrip overlap section which penetrates the upper conductive ground plane, wherein the microstrip overlap section, the insulating layer and the stripline overlap section are attached uniformly and tightly in sequence and fixed together by the insulating fixing component.

In a further aspect, the microstrip further has a microstrip matching section which is located on the upper conductive ground plane, and the microstrip is mounted on the upper conductive ground plane through the microstrip matching section.

In a further aspect, the microstrip overlap section, the insulating layer and the stripline overlap section are fixed to the lower conductive ground plane through the insulating fixing component.

In a further aspect, the penetrating fixing end of the insulating fixing component penetrates the microstrip overlap section, the insulating layer and the stripline overlap section in sequence, or the penetrating fixing end of the insulating fixing component penetrates the stripline overlap section, the insulating layer and the microstrip overlap section in sequence, so as to fix the microstrip overlap section, the insulating layer and the stripline overlap section together.

In a further aspect, the insulating fixing component is a plastic rivet, a plastic screw and its matching nut, or a plastic snap-in fastener.

In yet another aspect, the plastic snap-in fastener is an inverted shaped snap-in fastener, the upper end of which penetrates the stripline overlap section, the insulating layer and the microstrip overlap section in sequence, so as to fix the microstrip overlap section, the insulating layer and the stripline overlap section together.

In yet another aspect, the two lower ends of the inverted Y shaped snap-in fastener are snapped in the lower conductive ground plane respectively so as to be fixed with the lower conductive ground plane.

In a further aspect, the upper conductive ground plane and the lower conductive plane are metal plates.

In yet another aspect, the metal plates are aluminum plates.

In a further aspect, the upper conductive ground plane has a perforation through which the microstrip overlap section penetrates the upper conductive ground plane.

In a further aspect, the thickness d of the insulating layer typically meets the following relationship:

$$\frac{d}{2\times\pi\times f\times\varepsilon_r\times\varepsilon_0\times A} < 4,$$

wherein, f is the working frequency of the capacitor formed by the upper conductive ground plane, the insulating layer and the lower conductive ground plane, $\in_r$ is the relative permittivity or the dielectric constant of the insulating layer, $\in_0$ is the permittivity of free space, A is the overlap area of the microstrip overlap section and the stripline overlap section.

In yet another aspect, the thickness d of the insulating layer is 0.01~2 mm.

In yet another aspect, the thickness of the insulating layer d=0.05 mm, f=1710 MHz, $\in_0$=8.851×10$^{-12}$ F/m, $\in_r$=3.2, then A>40 mm$^2$.

In a further aspect, the insulating layer is a thin plastic gasket, a thin layer of conformal coat applied to the stripline overlap section or the microstrip overlap section, or a thin insulating layer applied to the stripline overlap section or the microstrip overlap section and created by a chemical process such as hard coat anodizing or E-coat process.

In yet another aspect, the thin plastic gasket is a polyester gasket.

In a further aspect, the capacitively coupled stripline to microstrip transition further comprises:

an insulating fixing element; and a capacitive coupled grounding block, located between the upper conductive ground plane and the lower conductive ground plane, and fixed to the upper conductive ground plane and the lower conductive ground plane by the insulating fixing element, wherein the microstrip overlap section, the insulating layer and the stripline overlap section fixed together by the insulating fixing component are located in the capacitive coupled grounding block.

In yet another aspect, the capacitive coupled grounding block is designed to surround the microstrip overlap section and the stripline overlap section to prevent parallel plate mode and to contribute to broadening the bandwidth of the impedance match of the transition.

In yet another aspect, the stripline further has a stripline matching section which penetrates the capacitive coupled grounding block.

In yet another aspect, the insulating fixing element includes at least one insulating snap-in clip, which penetrates the upper conductive ground plane, the capacitive coupled grounding block and the lower conductive ground plane in sequence so as to fix the upper conductive ground plane, the capacitive coupled grounding block and the lower conductive ground plane by attaching the upper conductive ground plane, the capacitive coupled grounding block and the lower conductive ground plane uniformly and tightly in sequence.

In yet another aspect, the insulating snap-in clip is a plastic snap-in clip.

In yet another aspect, the plastic snap-in clip is a polycarbonate snap-in clip.

In yet another aspect, the capacitively coupled stripline to microstrip transition further comprises:

an upper capacitive coupled grounding insulating layer, located between the upper conductive ground plane and the capacitive coupled grounding block, and fixed to the upper conductive ground plane and the capacitive coupled grounding block by the insulating fixing element; and a lower capacitive coupled grounding insulating layer, located between the capacitive coupled grounding block and the lower conductive ground plane, and fixed to the capacitive coupled grounding block and the lower conductive ground plane by the insulating fixing element.

In yet another aspect, the upper capacitive coupled grounding insulating layer and the lower capacitive coupled grounding insulating layer are U-shaped capacitive coupled grounding insulating layers.

In a further aspect, an opening is provided in the lower conductive ground plane and underneath the stripline overlap section.

In a second aspect of the present invention, a capacitively coupled stripline to microstrip transition comprises:

an upper conductive ground plane;

a lower conductive ground plane;

an insulating layer;

an insulating fixing component;

a stripline, positioned between the upper conductive ground plane and the lower conductive ground plane, and having a stripline overlap section;

a microstrip, mounted on the upper conductive ground plane, and having a microstrip overlap section which penetrates the upper conductive ground plane, wherein the microstrip overlap section, the insulating layer and the stripline overlap section are attached uniformly and tightly in sequence and fixed together by the insulating fixing component;

an insulating fixing element;

a capacitive coupled grounding block, located between the upper conductive ground plane and the lower conductive ground plane, and fixed to the upper conductive ground plane and the lower conductive ground plane by the insulating fixing element, wherein the microstrip overlap section, the insulating layer and the stripline overlap section fixed together by the insulating fixing component are located in the capacitive coupled grounding block;

wherein the thickness d of the insulating layer typically meets the following relationship:

$$\frac{d}{2\times\pi\times f\times\varepsilon_r\times\varepsilon_0\times A}<4,$$

wherein, f is the working frequency of the capacitor formed by the upper conductive ground plane, the insulating layer and the lower conductive ground plane, $\in_r$ is the relative permittivity or the dielectric constant of the insulating layer, $\in_0$ is the permittivity of free space, A is the overlap area of the microstrip overlap section and the stripline overlap section.

In a further aspect, the microstrip further has a microstrip matching section which is located on the upper conductive ground plane, and the microstrip is mounted on the upper conductive ground plane through the microstrip matching section.

In a further aspect, the microstrip overlap section, the insulating layer and the stripline overlap section are fixed to the lower conductive ground plane through the insulating fixing component.

In a further aspect, the penetrating fixing end of the insulating fixing component penetrates the microstrip overlap section, the insulating layer and the stripline overlap section in sequence, or the penetrating fixing end of the insulating fixing component penetrates the stripline overlap section, the insulating layer and the microstrip overlap section in sequence, so as to fix the microstrip overlap section, the insulating layer and the stripline overlap section together.

In a further aspect, the insulating fixing component is a plastic rivet, a plastic screw and its matching nut, or a plastic snap-in fastener.

In yet another aspect, the plastic snap-in fastener is an inverted Y shaped snap-in fastener, the upper end of which penetrates the stripline overlap section, the insulating layer and the microstrip overlap section in sequence, so as to fix the microstrip overlap section, the insulating layer and the stripline overlap section together.

In yet another aspect, the two lower ends of the inverted Y shaped snap-in fastener are snapped in the lower conductive ground plane respectively so as to be fixed with the lower conductive ground plane.

In a further aspect, the upper conductive ground plane has a perforation through which the microstrip overlap section penetrates the upper conductive ground plane.

In a further aspect, the thickness d of the insulating layer is 0.01~2 mm.

In a further aspect, the thickness of the insulating layer d=0.05 mm, f=1710 MHz, $\in_0=8.851\times10^{-12}$ F/m, $\in_r=3.2$, then $A>40$ mm$^2$.

In a further aspect, the capacitive coupled grounding block is designed to surround the microstrip overlap section and the stripline overlap section to prevent parallel plate mode and to contribute to broadening the bandwidth of the impedance match of the transition.

In a further aspect, the stripline further has a stripline matching section which penetrates the capacitive coupled grounding block.

In a further aspect, the insulating fixing element includes at least one insulating snap-in clip, which penetrates the upper conductive ground plane, the capacitive coupled grounding block and the lower conductive ground plane in sequence so as to fix the upper conductive ground plane, the capacitive coupled grounding block and the lower conductive ground plane by attaching the upper conductive ground plane, the capacitive coupled grounding block and the lower conductive ground plane uniformly and tightly in sequence.

In a further aspect, the capacitively coupled stripline to microstrip transition further comprises:

an upper capacitive coupled grounding insulating layer, located between the upper conductive ground plane and the capacitive coupled grounding block, and fixed to the upper conductive ground plane and the capacitive coupled grounding block by the insulating fixing element; and a lower capacitive coupled grounding insulating layer, located between the capacitive coupled grounding block and the lower conductive ground plane, and fixed to the capacitive coupled grounding block and the lower conductive ground plane by the insulating fixing element.

In yet another aspect, the upper capacitive coupled grounding insulating layer and the lower capacitive coupled grounding insulating layer are U-shaped capacitive coupled grounding insulating layers.

In a further aspect, an opening is provided in the lower conductive ground plane and underneath the stripline overlap section.

In a third aspect of the present invention, an antenna is provided and comprises a stripline and a microstrip, wherein the antenna further comprises:

an upper conductive ground plane;

a lower conductive ground plane;

an insulating layer;

an insulating fixing component;

wherein the stripline is positioned between the upper conductive ground plane and the lower conductive ground plane, and has a stripline overlap section; the microstrip is mounted on the upper conductive ground plane, and has a microstrip overlap section which penetrates the upper conductive ground plane, the microstrip overlap section, the insulating layer and the stripline overlap section are attached uniformly and tightly in sequence and fixed together by the insulating fixing component.

The beneficial effects of the present invention are as follows:

1. The capacitively coupled stripline to microstrip transition of the present invention makes the microstrip overlap section of the microstrip on the upper conductive ground plane penetrate the upper conductive ground plane and couples the microstrip overlap section to the stripline overlap section of the stripline between the upper conductive ground plane and the lower conductive ground plane with the insulating layer, thus the upper conductive ground plane, the insulating layer and the lower conductive ground plane make a capacitive coupling mode, so the present invention is designed skillfully and simple in structure, avoids metals' direct contact to eliminate the PIM problem, to completely eliminate unstable factors, and therefore is suitable for large-scale popularization.

2. The microstrip overlap section, the insulating layer and the stripline overlap section of the capacitively coupled stripline to microstrip transition of the present invention are fixed together by the insulating fixing component such as the insulating rivet(s), and not all fasteners used in the prior art are needed, so the present invention is easy to assemble and space saving which will avoid much interference mechanically, at the same saves labor time. Therefore the present invention is suitable for large-scale popularization.

3. The capacitive coupled grounding block is arranged between the upper conductive ground plane and the lower conductive ground plane of the capacitively coupled stripline to microstrip transition of the present invention, and the microstrip overlap section, the insulating layer and the stripline overlap section fixed together by the insulating fixing component are located in the capacitive coupled grounding block, thus the upper conductive ground plane, the capacitive coupled grounding block and the lower conductive ground plane make a capacitive grounding mode, so the present invention is designed skillfully and simple in structure, so as to further eliminate the PIM risk, improve insertion loss and provide high isolation from neighboring transitions, to completely eliminate unstable factors, and therefore is suitable for large-scale popularization.

4. The upper conductive ground plane, the capacitive coupled grounding block and the lower conductive ground plane of the capacitively coupled stripline to microstrip transition of the present invention are fixed together by the insulating fixing element such as the insulating rivet(s), and not all fasteners used in the prior art are needed, so the present invention is easy to assemble and space saving which will avoid much interference mechanically, at the same time saves labor time. Therefore the present invention is suitable for large-scale popularization.

5. The present invention further improve the performance of the structure such as the return loss, the reflection coefficient, the operating bandwidth of the transition and so on, through the opening provided in the lower conductive ground plane and underneath the stripline overlap section. Therefore the present invention is suitable for large-scale popularization.

DETAILED DESCRIPTION OF THE PREFERRED EMBODIMENT

Figure 6:
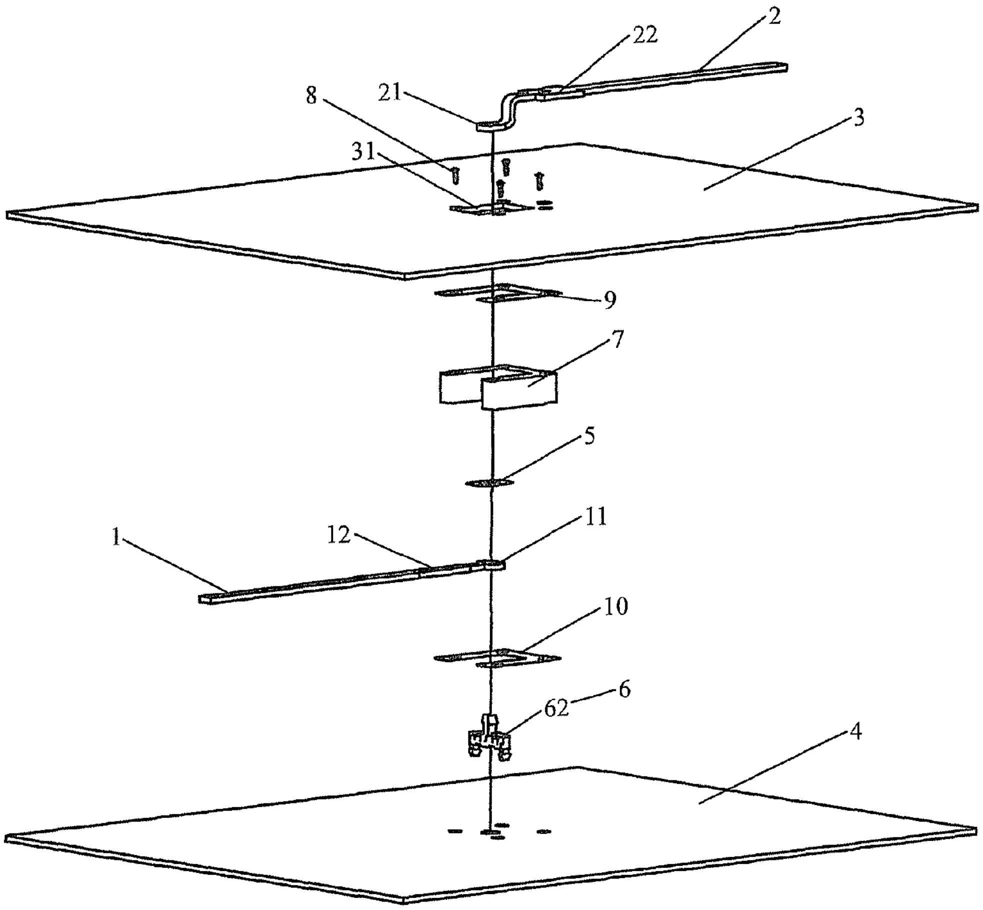
FIG. 6 is a schematic exploded view of another embodiment of the capacitively coupled stripline to microstrip transition of the present invention.
Figure 7:
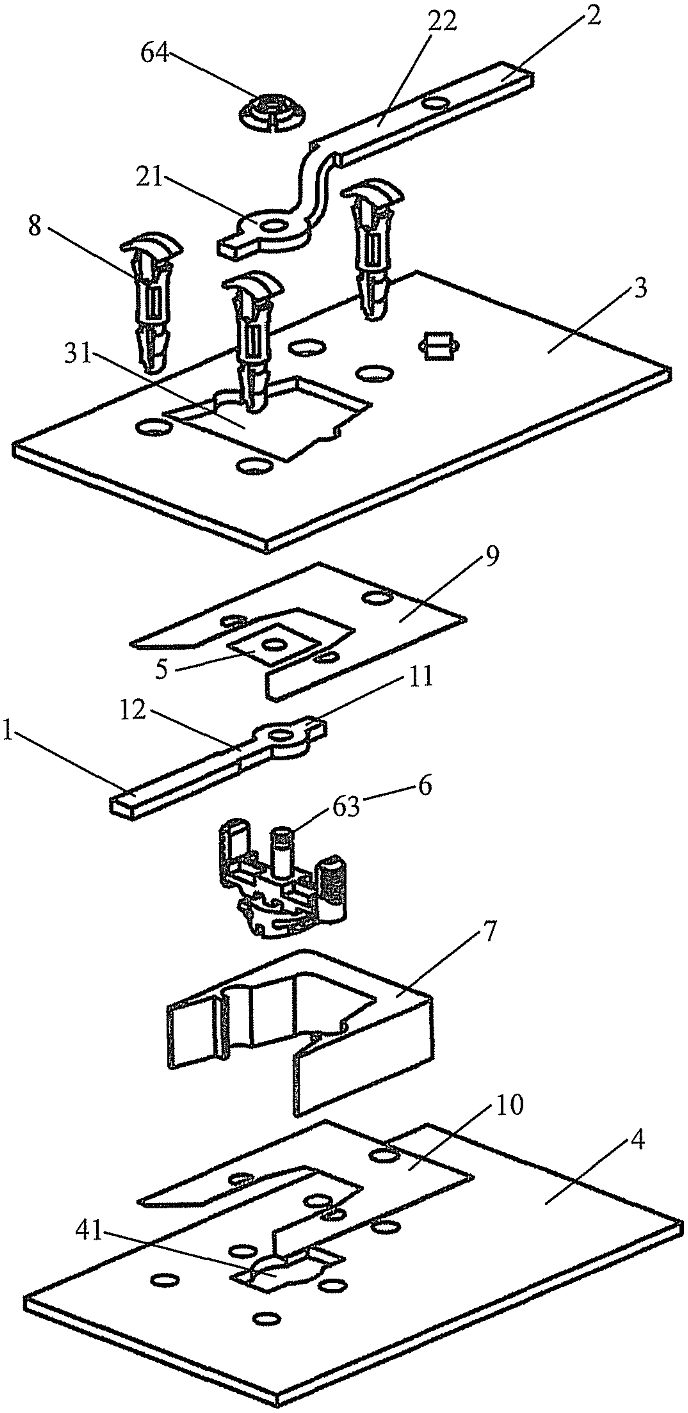
FIG. 7 is a schematic exploded view of another embodiment of the capacitively coupled stripline to microstrip transition of the present invention.
Figure 8:
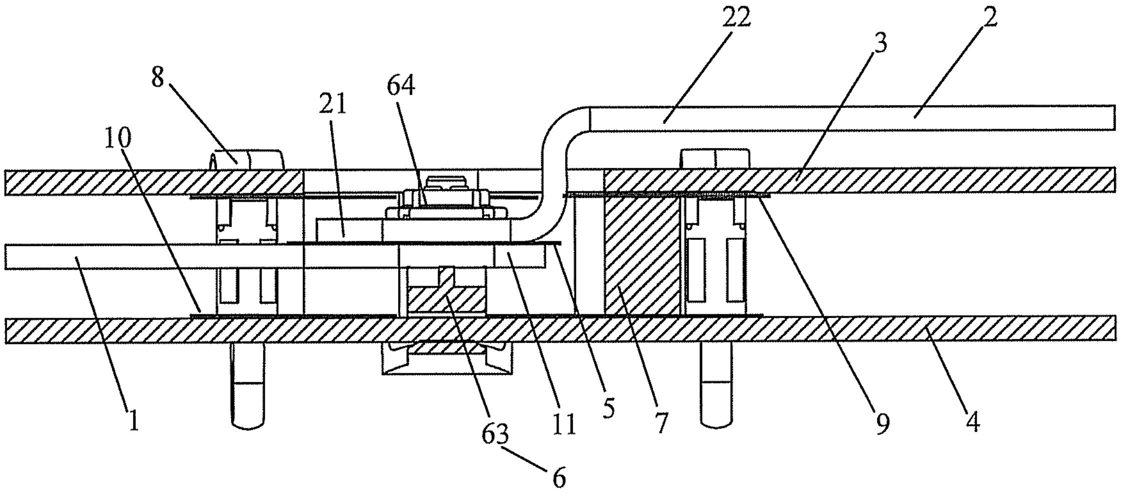
FIG. 8 is a schematic cutaway view of the embodiment shown in FIG. 7

In order to understand the technical content of the present invention clearly, the present invention is further exemplified by reference to the following examples. Wherein what FIG. 1-5 show is an embodiment of the capacitively coupled stripline to microstrip transition of the present invention, while what FIG. 6 shows is another embodiment of the capacitively coupled stripline to microstrip transition of the present invention, and what FIG. 7 and FIG. 8 show is another embodiment of the capacitively coupled stripline to microstrip transition of the present invention. Wherein, the same components adopt the same reference numerals.

The capacitively coupled stripline to microstrip transition of the present invention can be used for assembling the low cost antennas. The transition comprises a stripline 1, a microstrip 2, an upper conductive ground plane 3, a lower conductive ground plane 4, an insulating layer 5, an insulating fixing component 6, a capacitive coupled grounding block 7 and an insulating fixing element 8. The stripline 1 is positioned between the upper conductive ground plane 3 and the lower conductive ground plane 4, and has a stripline overlap section 11. The microstrip 2 is mounted on the upper conductive ground plane 3, and has a microstrip overlap section 21 which penetrates the upper conductive ground plane 3, wherein the microstrip overlap section 21, the insulating layer 5 and the stripline overlap section 11 are attached uniformly and tightly in sequence and fixed together by the insulating fixing component 6. The capacitive coupled grounding block 7 is located between the upper conductive ground plane 3 and the lower conductive ground plane 4, and fixed to the upper conductive ground plane 3 and the lower conductive ground plane 4 by the insulating fixing element 8. The microstrip overlap section 21, the insulating layer 5 and the stripline overlap section 11 fixed together by the insulating fixing component 6 are located in the capacitive coupled grounding block 7.

The microstrip 2 can be mounted on the upper conductive ground plane 3 in any suitable manner, preferably, the microstrip 2 further has a microstrip matching section 22 which is located on the upper conductive ground plane 3, and the microstrip 2 is mounted on the upper conductive ground plane 3 through the microstrip matching section 22. Please refer to FIGS. 1, 2 and 5, in one embodiment of the present invention, the microstrip matching section 22 and the upper conductive ground plane 3 can be fixed with components such as plastic rivets, or plastic screws and their matching nuts.

The microstrip overlap section 21, the insulating layer 5 and the stripline overlap section 11 do not need to be fixed to the lower conductive ground plane 4, please refer to one embodiment of the present invention shown in FIG. 1-5, the microstrip overlap section 21, the insulating layer 5 and the stripline overlap section 11 can be fixed by only fixing the microstrip 2 to the upper conductive ground plane 3. In fact, the stripline 1 is normally embedded in the insulating dielectric (not shown) between the upper conductive ground plane 3 and the lower conductive ground plane 4. The microstrip overlap section 21, the insulating layer 5 and the stripline overlap section 11 can also be fixed to the lower conductive ground plane 4, to enhance the fixation effect, please refer to FIG. 6. in another embodiment of the present invention, the microstrip overlap section 21, the insulating layer 5 and the stripline overlap section 11 are fixed to the lower conductive ground plane 4 through the insulating fixing component 6.

The insulating fixing component 6 can fix the microstrip overlap section 21, the insulating layer 5 and the stripline overlap section 11 in any suitable manner. Please refer to FIG. 5, in one embodiment of the present invention, the penetrating fixing end of the insulating fixing component 6 penetrates the microstrip overlap section 21, the insulating layer 5 and the stripline overlap section 11 in sequence, or as shown in FIG. 6, in another embodiment of the present invention, the penetrating fixing end of the insulating fixing component 6 penetrates the stripline overlap section 11, the insulating layer 5 and the microstrip overlap section 21 in sequence, so as to fix the microstrip overlap section 21, the insulating layer 5 and the stripline overlap section 11 together.

The insulating fixing component 6 can be any suitable component. Preferably, the insulating fixing component 6 is a plastic rivet 61, a plastic screw and its matching nut, or a plastic snap-in fastener. Please refer to FIG. 5, in one embodiment of the present invention, the insulating fixing component 6 is a plastic rivet 61, the penetrating fixing end of the plastic rivet 61 penetrates the microstrip overlap section 21, the insulating layer 5 and the stripline overlap section 11 in sequence, so as to fix the microstrip overlap section 21, the insulating layer 5 and the stripline overlap section 11 together. Please refer to FIG. 6, in another embodiment of the present invention, the insulating fixing component 6 is an inverted Y shaped snap-in fastener 62, the upper end (i.e. the penetrating fixing end) of the inverted Y shaped snap-in fastener 62 penetrates the stripline overlap section 11, the insulating layer 5 and the microstrip overlap section 21 in sequence, so as to fix the microstrip overlap section 21, the insulating layer 5 and the stripline overlap section 11 together. The two lower ends of the inverted Y shaped snap-in fastener 62 are snapped in the lower conductive ground plane 4 respectively so as to be fixed with the lower conductive ground plane 4.

The upper conductive ground plane 3 and the lower conductive plane 4 are used for the grounding of the stripline 1, at the same time the upper conductive ground plane 3 is the conductive ground plane of the microstrip 2, i.e. the upper conductive ground plane 3 is the common ground plane of the stripline 1 and the microstrip 2. And they can be made of any suitable material, preferably, the upper conductive ground plane 3 and the lower conductive plane 4 are metal plates. Please refer to the two embodiments as shown in FIGS. 1-5 and FIG. 6, the metal plates are aluminum plates.

The microstrip overlap section 21 can penetrate the upper conductive ground plane 3 in any suitable manner. Please refer to the two embodiments as shown in FIGS. 1-5 and FIG. 6, the upper conductive ground plane 3 has a perforation 31 through which the microstrip overlap section 21 penetrates the upper conductive ground plane 3.

The main role of the insulating layer 5 is to prevent direct contact between the microstrip overlap section 21 and the stripline overlap section 11 coupled on as to make a coupling structure between the microstrip overlap section 21 and the stripline overlap section 11. This separation is also used to avoid the effect of third-order passive intermodulation to the antenna caused by the direct and untight contact between metal parts. If metal to metal contact is present, then very high contact pressures are required to avoid PIM. The insulating layer 5 can be made of any suitable material, which must be strong enough to not be punctured by surface imperfections on the conductors, and withstand high temperatures created by high RF power levels. This dielectric material must be slightly larger than the metal overlap area to prevent any metal to metal contact. Preferably, the insulating layer 5 can be a thin plastic gasket, a thin layer of conformal coat applied to the stripline overlap section or the microstrip overlap section, or a thin insulating layer applied to the stripline overlap section or the microstrip overlap section and created by a chemical process such as hard coat anodizing or E-coat process. Please refer to the two embodiments as shown in FIGS. 1-5 and FIG. 6, the plastic gasket is a polyester gasket with a thickness of 0.05 mm. As is known in the art, the polyester gasket is currently the thinnest and most economical gasket that can be found on the market, and made of polyester film, and mainly plays the roles of insulation and minimizing the distance between the two coupled things.

The thickness of the insulating layer 5 should be as thin as possible, thus the coupling efficiency can be increased. But if the thickness should be increased, the coupling efficiency can be maintained by expanding the coupling area.

The relationship of the thickness of the insulating layer 5 and the coupling area is described as follows:

The whole design can be approximately regarded as a capacitor structure, whose electrical reactance is $$X = \frac{1}{2\pi f C},$$

wherein f is the working frequency, and C is the capacitance value. When the C is infinite and X=0, then it is considered to be totally short-circuit. In practical use, when X≤4, a sufficient short-circuit effect can be obtained. As is known to all, the capacitance value $$C = \frac{\varepsilon_r \times \varepsilon_0 \times A}{d},$$

wherein $\in_r$ is the relative permittivity or the dielectric constant of the dielectric, that is, the insulating layer 5 of this design, $\in_0$ is the permittivity of free space, $\in_0=8.851\times10^{-12}$ F/m, A is the overlap area of the microstrip overlap section 21 and the stripline overlap section 11, d is the thickness of the insulating layer 5. Therefore, in order to obtain a sufficient short-circuit effect, typically the following relationship must be met:

$$\frac{d}{2\times\pi\times f\times\varepsilon_r\times\varepsilon_0\times A} < 4.$$

The thickness d of the insulating layer 5 is preferably 0.01~2 mm. Of course, it can also be outside of the range.

For example: If Mylar is chosen as the material for the insulating layer 5 ($\in_r$=3.2), the thickness of the insulating layer 5 d=0.05 mm and the working frequency f=1710 MHz, the overlap area that can enable it to work A>40 $mm^2$.

The main function of the capacitive coupled grounding block 7 is to electrically connect the upper conductive ground plane 3 and the lower conductive ground plane 4 at the same potential in order to maximize energy transfer from the stripline 1 to the microstrip 2. The present invention can work without the capacitive coupled grounding block 7, but most likely with degraded performance in some parameter such as insertion loss, frequency bandwidth, or possibly isolation between neighboring networks.

The capacitive coupled grounding block 7 is designed to surround the microstrip overlap section 21 and the stripline overlap section 11 to prevent parallel plate mode and to contribute to broadening the bandwidth of the impedance match of the transition, and can be any suitable shape, such as U-Shaped, V-Shaped or C-Shaped. Please refer to the two embodiments as shown in FIGS. 1-5 and FIG. 6, the capacitive coupled grounding block 7 is a U-shaped capacitive coupled grounding block. The stripline 1 further has a stripline matching section 12 which penetrates the capacitive coupled grounding block 7. The stripline matching section 12 is used to decrease the reflection coefficient of the transition structure, the change of the width of the stripline 1 changes the impedance, and is used to adjust the variable of the return loss of the transition structure. The U-shaped capacitive coupled grounding block surrounds the microstrip overlap section 21, the insulating layer 5 and the stripline overlap section 11 fixed together by the insulating fixing component 6 at three sides, to prevent coupling of energy to adjacent signal lines or possibly other transitions, and works well.

The insulating fixing element 8 can be any suitable element. Preferably, the insulating fixing element 8 includes at least one insulating snap-in clip, which penetrates the upper conductive ground plane 3, the capacitive coupled grounding block 7 and the lower conductive ground plane 4 in sequence so as to fix them by attaching them uniformly and tightly in sequence. More preferably, the insulating snap-in clip is a plastic snap-in clip. Please refer to the two embodiments as shown in FIGS. 1-5 and FIG. 6, the plastic snap-in clip is a polycarbonate snap-in clip.

It should be noted that the insulating fixing element 8 is not limited to snap-in clips, all structures that can guarantee not only the insulation but also the close linkage between the upper conductive ground plane 3 and the lower conductive ground plane 4 can be used, for example, the upper conductive ground plane 3 and the lower conductive ground plane 4 can be fixed with a double-sided adhesive, or rivets, or plastic screws and nuts, or snap-in fasteners, etc.

Preferably, an upper capacitive coupled grounding insulating layer 9 and a lower capacitive coupled grounding insulating layer 10 can be further arranged, the upper capacitive coupled grounding insulating layer 9 is located between the upper conductive ground plane 3 and the capacitive coupled grounding block 7, and fixed to the upper conductive ground plane 3 and the capacitive coupled grounding block 7 by the insulating fixing element 8; and the lower capacitive coupled grounding insulating layer 10 is located between the capacitive coupled grounding block 7 and the lower conductive ground plane 4, and fixed to the capacitive coupled grounding block 7 and the lower conductive ground plane 4 by the insulating fixing element 8. The upper capacitive coupled grounding insulating layer 9 and the lower capacitive coupled grounding insulating layer 10 can be any suitable shapes, please refer to the two embodiments as shown in FIGS. 1-5 and FIG. 6, the upper capacitive coupled grounding insulating layer 9 and the lower capacitive coupled grounding insulating layer 10 are U-shaped capacitive coupled grounding insulating layers. The insulating function of the upper capacitive coupled grounding insulating layer 9 and lower capacitive coupled grounding insulating layer 10 can be accomplished with any insulating layer, such as thin plastic gaskets, a thin layer of conformal coat applied to the capacitive coupled grounding block 7, or a thin insulating layer applied to the capacitive coupled grounding block 7 and created by a chemical process applied to the metal grounding block such as hard coat anodizing or E-coat process.

Figure 1:
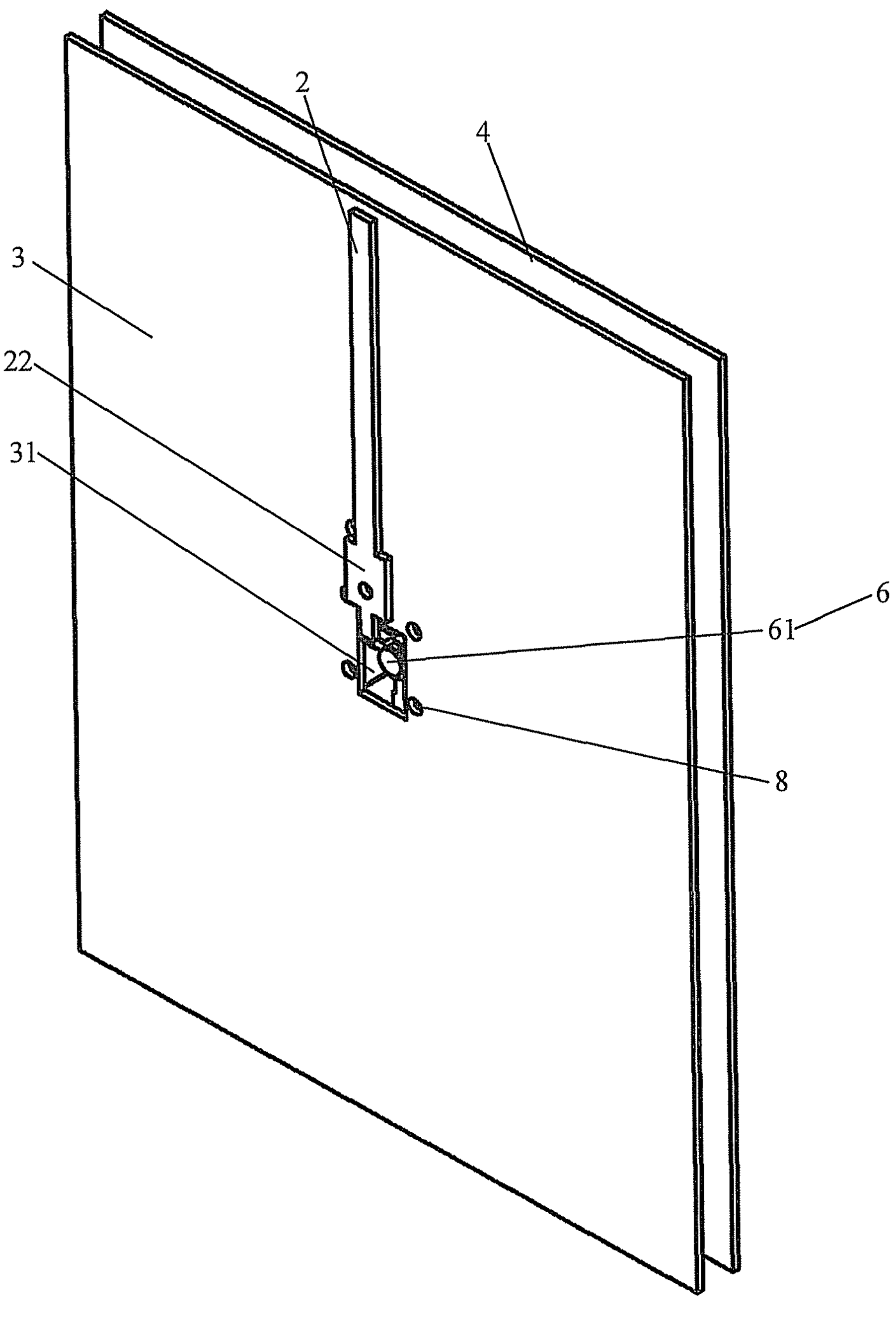
FIG. 1 is a schematic view of the three-dimensional structure of one embodiment of the capacitively coupled stripline to microstrip transition of the present invention.
Figure 2:
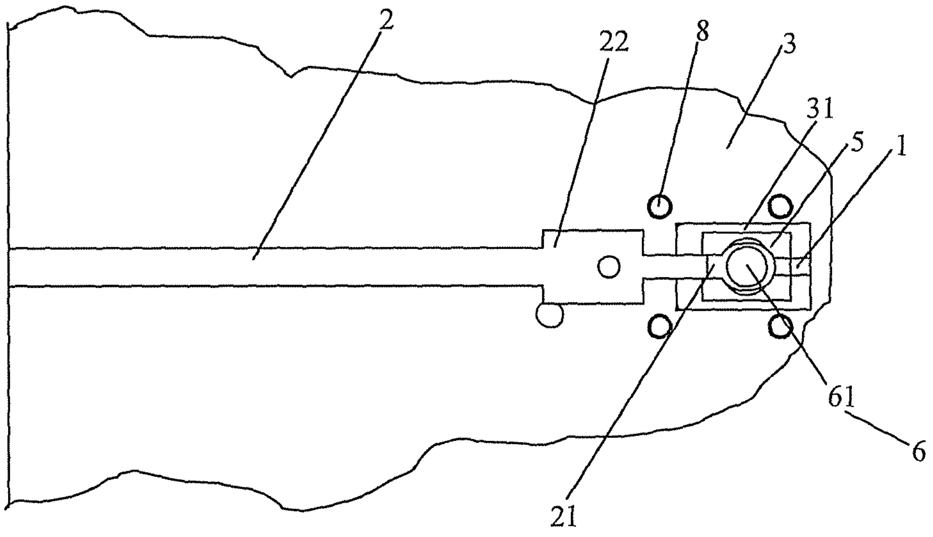
FIG. 2 is a partial enlarged schematic front view of the embodiment shown in FIG. 1.
Figure 3:
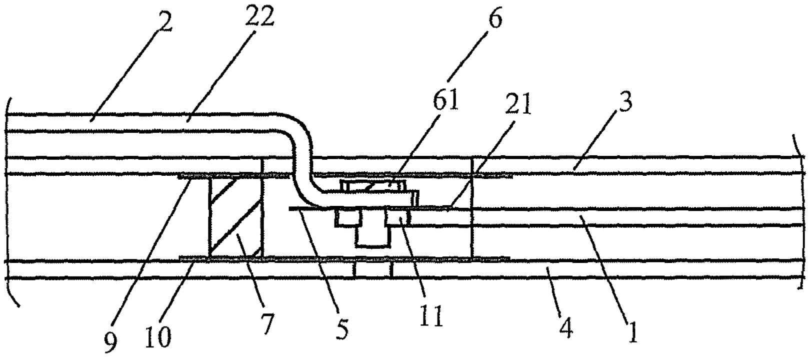
FIG. 3 is a partial enlarged schematic cutaway view of the embodiment shown in FIG. 1.
Figure 4:
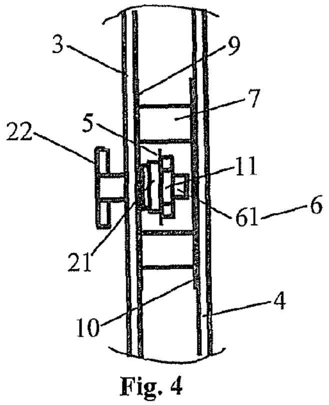
FIG. 4 is a partial enlarged schematic bottom view of the embodiment shown in FIG. 1.
Figure 5:
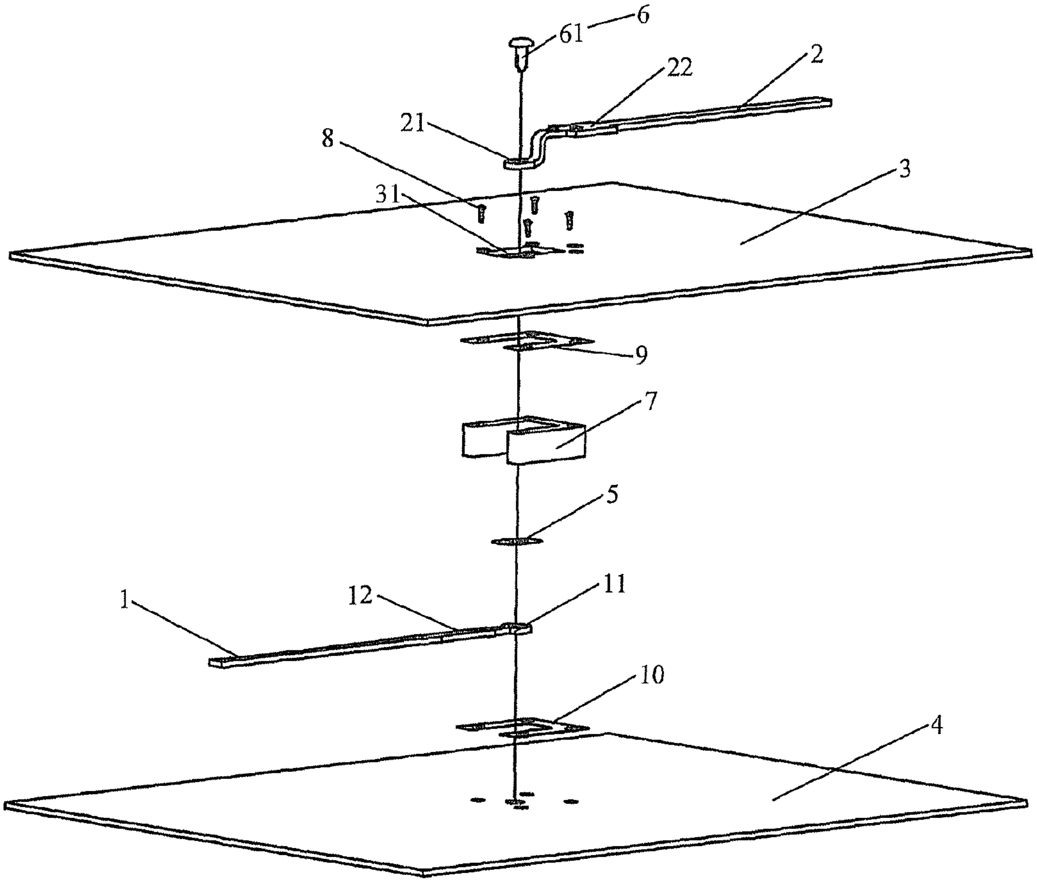
FIG. 5 is a schematic exploded view of the embodiment shown in FIG. 1.

When the embodiment as shown in FIG. 1 is assembled, please refer to FIG. 5, the microstrip overlap section 21 of the microstrip 2 penetrates the upper conductive ground plane 3, the penetrating fixing end of the plastic rivet 61 penetrates the microstrip overlap section 21, the insulating layer 5 and the stripline overlap section 11 in sequence, so as to fix the microstrip overlap section 21, the insulating layer 5 and the stripline overlap section 11 together; the penetrating fixing ends of other plastic rivets penetrate the microstrip matching section 22 of the microstrop 2 and the upper conductive ground plane 3 in sequence, so as to fix the microstrip 2 and the upper conductive ground plane 3; the capacitive coupled grounding block 7 is positioned between the upper conductive ground plane 3 and the lower conductive ground plane 4, the upper capacitive coupled grounding insulating layer 9 is positioned between the upper conductive ground plane 3 and the capacitive coupled grounding block 7, the lower capacitive coupled grounding insulating layer 10 is positioned between the capacitive coupled grounding block 7 and the lower conductive ground plane 4, the upper conductive ground plane 3, the upper capacitive coupled grounding insulating layer 9, the capacitive coupled grounding block 7, the lower capacitive coupled grounding insulating layer 10 and the lower conductive ground plane 4 are fixed with the insulating rivets on which glue can be dropped to enhance the fixation effect.

When the embodiment as shown in FIG. 6 is assembled, the microstrip overlap section 21 of the microstrip 2 penetrates the upper conductive ground plane 3, the upper end of the Y shaped snap-in fastener 62 penetrates the stripline overlap section 11, the insulating layer 5 and the microstrip overlap section 21 in sequence, so as to fix the microstrip overlap section 21, the insulating layer 5 and the stripline overlap section 11 together; the two lower ends of the inverted Y shaped snap-in fastener 62 are snapped in the lower conductive ground plane 4 respectively, so as to be fixed with the lower conductive ground plane 4; the penetrating fixing ends of other plastic rivets penetrate the microstrip matching section 22 of the microstrip 2 and the upper conductive ground plane 3 in sequence, so as to fix the microstrip 2 and the upper conductive ground plane 3; the capacitive coupled grounding block 7 is positioned between the upper conductive ground plane 3 and the lower conductive ground plane 4, the upper capacitive coupled grounding insulating layer 9 is positioned between the upper conductive ground plane 3 and the capacitive coupled grounding block 7, the lower capacitive coupled grounding insulating layer 10 is positioned between the capacitive coupled grounding block 7 and the lower conductive ground plane 4, the upper conductive ground plane 3, the upper capacitive coupled grounding insulating layer 9, the capacitive coupled grounding block 7, the lower capacitive coupled grounding insulating layer 10 and the lower conductive ground plane 4 are fixed with the insulating rivets on which glue can be dropped to enhance the fixation effect.

It can be understood that the microstrip 2 of the present invention can be arranged under the lower conductive ground plane 4, in this case, the microstrip overlap section 21 penetrates the lower conductive ground plane 4, moreover the microstrip overlap section 21, the insulating layer 5 and the stripline overlap section 11 are attached uniformly and tightly in sequence and fixed together by the insulating fixing component 6.

Please refer to FIG. 7 and FIG. 8, compared with the embodiment of the present invention shown in FIG. 6, the differences of the embodiment of the present invention shown in FIG. 7 and FIG. 8 are that: (1) an opening 41 is provided in the lower conductive ground plane 4 and underneath the stripline to microstrip overlap area, to further improve the return loss, the reflection coefficient, the operating bandwidth of the transition; (2) the insulating fixing component 6 is a trident snap-in fastener 63, and a button 64 snaps down onto the middle post of the trident snap-in fastener 63 to provide a better compression force on the insulating layer 5.

The working principle of the present invention is to achieve a large enough overlapping area and a small enough distance to provide capacitive coupling within the working frequency bands, so as to avoid the third-order passive intermodulation effect of direct metal-to-metal contact. The capacitive coupled grounding block 7 at the end of the stripline 1 cuts off the parallel plate mode generated between the upper conductive ground plane 3 and the lower conductive ground plane 4, so as to improve insertion loss and isolation for dual poi antenna.

The fundamental problem the present invention aims to settle is the problem of signal interference existing in the process of the high-frequency signal transmission, in which the very advanced problem of signal interference is the "third-order passive intermodulation" problem. However, in the prior art, most of the technical solutions to solve the third-order passive intermodulation problem adopt the way of connecting two transmission lines directly and applying a continuous pressure. In such a technical solution, because the pressure applied will become unstable, the interference signal is generated, not only the signal to noise ratio and the channel quality of the signal will be seriously affected, but the following signal noise reduction and the filtering demodulation will be caused to be carried out with difficulty. While the technical solution the present invention adopts is a non-contact capacitive coupling method, i.e. the stripline is coupled to the transmission line—a microstrip of the antenna itself through a coupling structure, which is essentially a coupling of a transmission line to another transmission line, and wherein the insulating layer 5 is very thin, so as to obtain the capacitance as large as possible under the condition that the overlap area is as small as possible, to reduce the interference signal more, to reduce the influence to the receiving system.

Thus, the present invention couples the stripline 1 and the microstrip 2 capacitively, to avoid metals' direct contact, to eliminate the metal to metal contact which can cause PIM problems in base station antennas, to obviate the difficulty of maintaining the constant surface pressure, and completely eliminate unstable factors. In addition, the upper conductive ground plane 3 and the lower conductive ground plane 4 are coupled capacitively with the capacitive coupled grounding block 7, to prevent parallel plate modes, to eliminate the PIM risk, while also providing low insertion loss and high isolation from neighboring transitions.

To sum up, the capacitively coupled stripline to microstrip transition is designed skillfully, simple in structure, simple and convenient to assemble, has a low cost, avoids metals' direct contact to eliminate the PIM problem, further prevents the parallel plate mode, to further eliminate the PIM risk, improve insertion loss and provide high isolation from neighboring transitions, to completely eliminate unstable factors, and therefore is suitable for large-scale popularization.

While the present invention has been particularly shown and described with references to preferred embodiments thereof, it will be understood by those skilled in the art that various changes in form and details may be made therein without departing from the spirit and scope of the invention as defined by the claims. It is clearly understood therefore that the same is by way of illustration and example only and is not to be taken by way of limitation.

We claim:

1. A capacitively coupled stripline to microstrip transition, comprising:

an upper conductive ground plane;

a lower conductive ground plane;

an insulating layer;

an insulating fixing component;

a stripline, positioned between the upper conductive ground plane and the lower conductive ground plane, and having a stripline overlap section;

a microstrip, mounted on the upper conductive ground plane, and having a microstrip overlap section which penetrates the upper conductive ground plane, wherein the microstrip overlap section, the insulating layer and the stripline overlap section are attached uniformly and tightly in sequence and fixed together by the insulating fixing component.

2. The capacitively coupled stripline to microstrip transition according to claim 1, wherein the microstrip further has a microstrip matching section which is located on the upper conductive ground plane, and the microstrip is mounted on the upper conductive ground plane through the microstrip matching section.

3. The capacitively coupled stripline to microstrip transition according to claim 1, wherein the microstrip overlap section, the insulating layer and the stripline overlap section are fixed to the lower conductive ground plane through the insulating fixing component.

4. The capacitively coupled stripline to microstrip transition according to claim 1, wherein the penetrating fixing end of the insulating fixing component penetrates the microstrip overlap section, the insulating layer and the stripline overlap section in sequence, or the penetrating fixing end of the insulating fixing component penetrates the stripline overlap section, the insulating layer and the microstrip overlap section in sequence, so as to fix the microstrip overlap section, the insulating layer and the stripline overlap section together.

5. The capacitively coupled stripline to microstrip transition according to claim 1, wherein the insulating fixing component is a plastic rivet, a plastic screw and its matching plastic nut, or a plastic snap-in fastener.

6. The capacitively coupled stripline to microstrip transition according to claim 5, wherein the plastic snap-in fastener is an inverted Y shaped snap-in fastener, the upper end of which penetrates the stripline overlap section, the insulating layer and the microstrip overlap section in sequence, so as to fix the microstrip overlap section, the insulating layer and the stripline overlap section together.

7. The capacitively coupled stripline to microstrip transition according to claim 6, wherein the two lower ends of the inverted Y shaped snap-in fastener are snapped in the lower conductive ground plane respectively so as to be fixed with the lower conductive ground plane.

8. The capacitively coupled stripline to microstrip transition according to claim 1, wherein the upper conductive ground plane and the lower conductive plane are metal plates.

9. The capacitively coupled stripline to microstrip transition according to claim 8, wherein the metal plates are aluminum plates.

10. The capacitively coupled stripline to microstrip transition according to claim 1, wherein the upper conductive ground plane has a perforation through which the microstrip overlap section penetrates the upper conductive ground plane.

11. The capacitively coupled stripline to microstrip transition according to claim 1, wherein the thickness d of the insulating layer typically meets the following relationship:

$$\frac{d}{2\times\pi\times f\times\varepsilon_r\times\varepsilon_0\times A}<4,$$

wherein, f is the working frequency of the capacitor formed by the upper conductive ground plane, the insulating layer and the lower conductive ground plane, $\in_r$ is the relative permittivity or the dielectric constant of the insulating layer, $\in_0$ is the permittivity of free space, A is the overlap area of the microstrip overlap section and the stripline overlap section.

12. The capacitively coupled stripline to microstrip transition according to claim 11, wherein the thickness d of the insulating layer is 0.01~2 mm.

13. The capacitively coupled stripline to microstrip transition according to claim 11, wherein the thickness of the insulating layer d=0.05 mm, f=1710 MHz, $\in_0=8.851\times10^{-12}$ F/m, $\in_r=3.2$, then A>40 $mm^2$.

14. The capacitively coupled stripline to microstrip transition according to claim 1, wherein the insulating layer is a thin plastic gasket, a thin layer of conformal coat applied to the stripline overlap section or the microstrip overlap section, or a thin insulating layer applied to the stripline overlap section or the microstrip overlap section and created by a chemical process.

15. The capacitively coupled stripline to microstrip transition according to claim 14, wherein the thin plastic gasket is a polyester gasket.

16. The capacitively coupled stripline to microstrip transition according to claim 1, further comprising:

an insulating fixing element; and a capacitive coupled grounding block, located between the upper conductive ground plane and the lower conductive ground plane, and fixed to the upper conductive ground plane and the lower conductive ground plane by the insulating fixing element, wherein the microstrip overlap section, the insulating layer and the stripline overlap section fixed together by the insulating fixing component are located in the capacitive coupled grounding block.

17. The capacitively coupled stripline to microstrip transition according to claim 16, wherein the capacitive coupled grounding block is designed to surround the overlap section of the microstrip and the stripline to prevent parallel plate mode and to contribute to broadening the bandwidth of the impedance match of the transition.

18. The capacitively coupled stripline to microstrip transition according to claim 16, wherein the stripline further has a stripline matching section which penetrates the capacitive coupled grounding block.

19. The capacitively coupled stripline to microstrip transition according to claim 16, wherein the insulating fixing element includes at least one insulating snap-in clip, which penetrates the upper conductive ground plane, the capacitive coupled grounding block and the lower conductive ground plane in sequence so as to fix the upper conductive ground plane, the capacitive coupled grounding block and the lower conductive ground plane by attaching the upper conductive ground plane, the capacitive coupled grounding block and the lower conductive ground plane uniformly and tightly in sequence.

20. The capacitively coupled stripline to microstrip transition according to claim 19, wherein the insulating snap-in clip is a plastic snap-in clip.

21. The capacitively coupled stripline to microstrip transition according to claim 20, wherein the plastic snap-in clip is a polycarbonate snap-in clip.

22. The capacitively coupled stripline to microstrip transition according to claim 16, further comprising:

an upper capacitive coupled grounding insulating layer, located between the upper conductive ground plane and the capacitive coupled grounding block, and fixed to the upper conductive ground plane and the capacitive coupled grounding block by the insulating fixing element; and a lower capacitive coupled grounding insulating layer, located between the capacitive coupled grounding block and the lower conductive ground plane, and fixed to the capacitive coupled grounding block and the lower conductive ground plane by the insulating fixing element.

23. The capacitively coupled stripline to microstrip transition according to claim 22, wherein the upper capacitive coupled grounding insulating layer and the lower capacitive coupled grounding insulating layer are U-shaped capacitive coupled grounding insulating layers.

24. The capacitively coupled stripline to microstrip transition according to claim 1, wherein an opening is provided in the lower conductive ground plane and underneath the stripline overlap section.

25. A capacitively coupled stripline to microstrip transition, comprising:

an upper conductive ground plane;

a lower conductive ground plane;

an insulating layer;

an insulating fixing component;

a stripline, positioned between the upper conductive ground plane and the lower conductive ground plane, and having a stripline overlap section;

a microstrip, mounted on the upper conductive ground plane, and having a microstrip overlap section which penetrates the upper conductive ground plane, wherein the microstrip overlap section, the insulating layer and the stripline overlap section are attached uniformly and tightly in sequence and fixed together by the insulating fixing component;

an insulating fixing element;

a capacitive coupled grounding block, located between the upper conductive ground plane and the lower conductive ground plane, and fixed to the upper conductive ground plane and the lower conductive ground plane by the insulating fixing element, wherein the microstrip overlap section, the insulating layer and the stripline overlap section fixed together by the insulating fixing component are located in the capacitive coupled grounding block;

wherein the thickness d of the insulating layer typically meets the following relationship:

$$\frac{d}{2\times\pi\times f\times\varepsilon_r\times\varepsilon_0\times A}<4,$$

wherein, f is the working frequency of the capacitor formed by the upper conductive ground plane, the insulating layer and the lower conductive ground plane, $\in_r$ is the relative permittivity or is the dielectric constant of the insulating layer, $\in_0$ is the permittivity of free space, A is the overlap area of the microstrip overlap section and the stripline overlap section.

26. The capacitively coupled stripline to microstrip transition according to claim 25, wherein the microstrip further has a microstrip matching section which is located on the upper conductive ground plane, and the microstrip is mounted on the upper conductive ground plane through the microstrip matching section.

27. The capacitively coupled stripline to microstrip transition according to claim 25, wherein the microstrip overlap section, the insulating layer and the stripline overlap section are fixed to the lower conductive ground plane through the insulating fixing component.

28. The capacitively coupled stripline to microstrip transition according to claim 25, wherein the penetrating fixing end of the insulating fixing component penetrates the microstrip overlap section, the insulating layer and the stripline overlap section in sequence, or the penetrating fixing end of the insulating fixing component penetrates the stripline overlap section, the insulating layer and the microstrip overlap section in sequence, so as to fix the microstrip overlap section, the insulating layer and the stripline overlap section together.

29. The capacitively coupled stripline to microstrip transition according to claim 25, wherein the insulating fixing component is a plastic rivet, a plastic screw and its matching plastic nut, or a plastic snap-in fastener.

30. The capacitively coupled stripline to microstrip transition according to claim 29, wherein the plastic snap-in fastener is an inverted Y shaped snap-in fastener, the upper end of which penetrates the stripline overlap section, the insulating layer and the microstrip overlap section in sequence, so as to fix the microstrip overlap section, the insulating layer and the stripline overlap section together.

31. The capacitively coupled stripline to microstrip transition according to claim 30, wherein the two lower ends of the inverted Y shaped snap-in fastener are snapped in the lower conductive ground plane respectively so as to be fixed with the lower conductive ground plane.

32. The capacitively coupled stripline to microstrip transition according to claim 25, wherein the upper conductive ground plane has a perforation through which the microstrip overlap section penetrates the upper conductive ground plane.

33. The capacitively coupled stripline to microstrip transition according to claim 25, wherein the thickness d of the insulating layer is 0.01~2 mm.

34. The capacitively coupled stripline to microstrip transition according to claim 25, wherein the thickness of the insulating layer d=0.05 mm, f=1710 MHz, $\in_0=8.851\times10^{-12}$ F/m, $\in_r=3.2$, then A>40 mm$^2$.

35. The capacitively coupled stripline to microstrip transition according to claim 26, wherein the capacitive coupled grounding block is designed to surround the microstrip overlap section and the stripline overlap section to prevent parallel plate mode and to contribute to broadening the bandwidth of the impedance match of the transition.

36. The capacitively coupled stripline to microstrip transition according to claim 25, wherein the stripline further has a stripline matching section which penetrates the capacitive coupled grounding block.

37. The capacitively coupled stripline to microstrip transition according to claim 25, wherein the insulating fixing element includes at least one insulating snap-in clip, which penetrates the upper conductive ground plane, the capacitive coupled grounding block and the lower conductive ground plane in sequence so as to fix the upper conductive ground plane, the capacitive coupled grounding block and the lower conductive ground plane by attaching the upper conductive ground plane, the capacitive coupled grounding block and the lower conductive ground plane uniformly and tightly in sequence.

38. The capacitively coupled stripline to microstrip transition according to claim 25, further comprising:

an upper capacitive coupled grounding insulating layer, located between the upper conductive ground plane and the capacitive coupled grounding block, and fixed to the upper conductive ground plane and the capacitive coupled grounding block by the insulating fixing element; and a lower capacitive coupled grounding insulating layer, located between the capacitive coupled grounding block and the lower conductive ground plane, and fixed to the capacitive coupled grounding block and the lower conductive ground plane by the insulating fixing element.

39. The capacitively coupled stripline to microstrip transition according to claim 38, wherein the upper capacitive coupled grounding insulating layer and the lower capacitive coupled grounding insulating layer are U-shaped capacitive coupled grounding insulating layers.

40. The capacitively coupled stripline to microstrip transition according to claim 25, wherein an opening is provided in the lower conductive ground plane and underneath the stripline overlap section.

41. An antenna, comprising a stripline and a microstrip, wherein the antenna further comprises:

an upper conductive ground plane;

a lower conductive ground plane;

an insulating layer;

an insulating fixing component;

wherein the stripline is positioned between the upper conductive ground plane and the lower conductive ground plane, and has a stripline overlap section; the microstrip is mounted on the upper conductive ground plane, and has a microstrip overlap section which penetrates the upper conductive ground plane, the microstrip overlap section, the insulating layer and the stripline overlap section are attached uniformly and tightly in sequence and fixed together by the insulating fixing component.

* * * * *

UNITED STATES PATENT AND TRADEMARK OFFICE

CERTIFICATE OF CORRECTION

PATENT NO. : 8,742,867 B2
APPLICATION NO. : 13/439358
DATED : June 3, 2014
INVENTOR(S) : Veihl et al.

It is certified that error appears in the above-identified patent and that said Letters Patent is hereby corrected as shown below:

Add to the title page:

Item (30) Foreign Application Priority Data
April 6, 2011 (CN) 201110085503.X

Signed and Sealed this
Twenty-third Day of December, 2014

Michelle K. Lee

Michelle K. Lee
*Deputy Director of the United States Patent and Trademark Office*